United States Patent
Wu et al.

(10) Patent No.: US 12,550,583 B2
(45) Date of Patent: Feb. 10, 2026

(54) DISPLAY PANEL, DISPLAY DEVICE, AND MANUFACTURING METHOD OF DISPLAY PANEL INCLUDING ANODE LAYER COMPRISING ANODE AND CONNECTION PORTION WITH UNDERCUT STRUCTURE

(71) Applicant: SHENZHEN CHINA STAR OPTOELECTRONICS SEMICONDUCTOR DISPLAY TECHNOLOGY CO., LTD., Guangdong (CN)

(72) Inventors: Fanjing Wu, Guangdong (CN); Jingyuan Hu, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 746 days.

(21) Appl. No.: 17/760,302

(22) PCT Filed: Jul. 29, 2022

(86) PCT No.: PCT/CN2022/109085
§ 371 (c)(1),
(2) Date: Aug. 7, 2022

(87) PCT Pub. No.: WO2024/016375
PCT Pub. Date: Jan. 25, 2024

(65) Prior Publication Data
US 2024/0215379 A1  Jun. 27, 2024

(30) Foreign Application Priority Data
Jul. 20, 2022 (CN) .......................... 202210856542.3

(51) Int. Cl.
*H10K 59/80* (2023.01)
*H10K 59/12* (2023.01)
*H10K 59/124* (2023.01)

(52) U.S. Cl.
CPC ... *H10K 59/80516* (2023.02); *H10K 59/1201* (2023.02); *H10K 59/124* (2023.02)

(58) Field of Classification Search
CPC ......... H10K 59/1201; H10K 59/80516; H10K 59/124; H10K 50/818; H10K 50/824; H10K 59/122; H10K 59/1315
See application file for complete search history.

(56) References Cited

U.S. PATENT DOCUMENTS 5,462,892 A * 10/1995 Gabriel ............. H01L 21/02071
438/720
2007/0236424 A1* 10/2007 Kimura .............. H10K 59/1213
345/76
(Continued)

FOREIGN PATENT DOCUMENTS

CN    1454035 A    11/2003
CN   112048303 A *  12/2020
(Continued)

OTHER PUBLICATIONS

Naser M. Ahmed, et al., "The Effect of Post Annealing Temperature on Grain Size of Indium-Tin-Oxide for Optical and Electrical Properties Improvement," Results in Physics, vol. 13, 2019, 102159, ISSN 2211-3797. (Year: 2019).*
(Continued)

*Primary Examiner* — Davienne N Monbleau
*Assistant Examiner* — John Patrick Cornely
(74) *Attorney, Agent, or Firm* — PV IP PC; Wei Te Chung

(57) ABSTRACT

A display panel, a display device, and a manufacturing method of the display panel are provided. The display panel
(Continued)

includes a base substrate, a thin film transistor layer, a planarization layer, an anode layer, and a cathode layer. The anode layer includes an anode and a connection portion. A first protruding portion protrudes from the connection portion. The first protruding portion and the planarization layer form an undercut structure. The cathode layer is electrically connected to the connection portion. The undercut structure and the anode layer are formed simultaneously during being performed a patterning process, thereby reducing a number of photomasks.

16 Claims, 4 Drawing Sheets

(56) References Cited

U.S. PATENT DOCUMENTS

| | | | | |
|---|---|---|---|---|
| 2010/0231116 A1* | 9/2010 | Ochi | .................... | H10K 50/805 |
| | | | | 313/352 |
| 2013/0277602 A1* | 10/2013 | Kazuhiko | ................ | C23F 1/36 |
| | | | | 252/79.1 |
| 2016/0043341 A1 | 2/2016 | Heo et al. | | |
| 2020/0220098 A1* | 7/2020 | Tsai | ....................... | H10K 71/00 |
| 2022/0093894 A1* | 3/2022 | Song | .................... | H10K 59/122 |

FOREIGN PATENT DOCUMENTS

| | | |
|---|---|---|
| CN | 112103326 A | 12/2020 |
| CN | 113097409 A | 7/2021 |
| CN | 113488514 A | 10/2021 |
| CN | 114141827 A | 3/2022 |
| JP | 2004134356 A | 4/2004 |

OTHER PUBLICATIONS

International Search Report in International application No. PCT/CN2022/109085, mailed on Dec. 21, 2022.

Written Opinion of the International Search Authority in International application No. PCT/CN2022/109085, mailed on Dec. 21, 2022.

Chinese Office Action issued in corresponding Chinese Patent Application No. 202210856542.3 dated Dec. 19, 2024, pp. 1-7.

* cited by examiner

DISPLAY PANEL, DISPLAY DEVICE, AND MANUFACTURING METHOD OF DISPLAY PANEL INCLUDING ANODE LAYER COMPRISING ANODE AND CONNECTION PORTION WITH UNDERCUT STRUCTURE

BACKGROUND OF INVENTION

Field of Invention

The present application relates to the field of display, and particularly to a display panel, a display device, and a manufacturing method of the display panel.

Description of Prior Art

With rapid development of display panels, requirements of large-sized display panels also increasingly grow up. However, when the large-size display panel (especially top emission panels) work, there will be a problem of voltage drop due to internal resistance in display centers, outside of centers, and peripheral edges. Therefore, additional auxiliary electrodes need to be manufactured in the display panel to apply additional assistance to regions with large voltage drops, so that screen display is uniform and stable when the entire display panel is working. Currently, remedy of the voltage drops is realized in the large-sized display panels through manufacturing undercut structures in the display panels and matching difference of organic light-emitting materials and evaporation angles of cathodes to make the cathodes link to the auxiliary electrodes. However, in the prior art, photomasks need to be added independently to manufacture of the undercut structures, which leads to complicated display panel manufacturing processes and high production cost.

SUMMARY OF INVENTION

Embodiments of the present application provide a display panel, a display device, and a manufacturing method of the display panel, which can solve the problem of complicated manufacturing processes and high production cost of the undercut structures in the current display panels.

One embodiment of the present application provides a display panel, including:
- a base substrate;
- a thin film transistor layer disposed on the base substrate, wherein the thin film transistor layer includes an auxiliary electrode;
- a planarization layer disposed on the thin film transistor layer, wherein a first opening is defined in the planarization layer, and the first opening exposes the auxiliary electrode;
- an anode layer disposed on a side of the planarization layer facing away the base substrate, wherein the anode layer includes an anode and a connection portion spaced apart, the connection portion is electrically connected to the auxiliary electrode, on a lateral surface of the connection portion facing toward the anode, a first protruding portion protrudes toward the anode; and the first protruding portion and the planarization layer form an undercut structure; and
- a cathode layer disposed on a side of the anode layer facing away the base substrate, wherein the cathode layer extends into the undercut structure and is electrically connected to the connection portion.

Optionally, in some embodiments of the present application, on a lateral surface of the connection portion facing toward the anode, a second protruding portion further protrudes toward the anode; the second protruding portion and the first protruding portion are spaced apart along a direction away from the base substrate, the second protruding portion and the first protruding portion form the undercut structure, and the cathode layer is electrically connected to the second protruding portion.

Optionally, in some embodiments of the present application, the connection portion includes a first linking portion, a first reflection portion, and a first electrode portion disposed in a stack along the direction away from the base substrate, the first linking portion is electrically connected to the auxiliary electrode, the first linking portion protrudes on a lateral surface of the first reflection portion facing toward the anode to form the second protruding portion, and the first electrode portion protrudes on a lateral surface of the first reflection portion facing toward the anode to form the first protruding portion.

Optionally, in some embodiments of the present application, an orthogonal projection of the first protruding portion on the base substrate at least partially overlaps with an orthogonal projection of the second protruding portion on the base substrate.

Optionally, in some embodiments of the present application, the anode includes a second linking portion, a second reflection portion, and a second electrode portion disposed in a stack along the direction away from the base substrate, the thin film transistor layer includes a source-drain layer, and the second linking portion is electrically connected to the source-drain layer.

Optionally, in some embodiments of the present application, the second electrode portion protrudes on a lateral surface of the second reflection portion facing toward the connection portion to form a third protruding portion, and the second linking portion protrudes on a lateral surface of the second reflection portion facing toward the connection portion to form a fourth protruding portion.

Optionally, in some embodiments of the present application, the first electrode portion includes indium tin oxide or indium zinc oxide, the first reflection portion includes an alloy of aluminum, nickel, copper, and lanthanum; and the first linking portion includes molybdenum or an alloy of molybdenum, titanium, and nickel.

Optionally, in some embodiments of the present application, the second electrode portion includes indium tin oxide or indium zinc oxide, the second reflection portion includes an alloy of aluminum, nickel, copper, and lanthanum; and the second linking portion includes molybdenum or an alloy of molybdenum, titanium, and nickel.

Optionally, in some embodiments of the present application, the thin film transistor layer includes a light-shielding layer, a gate electrode layer, and a source-drain layer, and the auxiliary electrode is disposed in a same layer with one of the light-shielding layer, the gate electrode layer, or the source-drain layer.

Optionally, in some embodiments of the present application, the display panel further includes:
- a pixel definition layer disposed on the planarization layer and the anode layer, wherein a pixel opening is defined in the pixel definition layer, the pixel opening exposes a part of the anode, a second opening is defined in the pixel definition layer, and the second opening exposes the first protruding portion and the second protruding portion;

a light-emitting layer disposed on the pixel definition layer and the anode layer, wherein the light-emitting layer partially covers the second protruding portion, and the cathode layer covers the light-emitting layer and is electrically connected to the second protruding portion.

Correspondingly, one embodiment of the present application further provides a display device, including the display panel mentioned in any one of the above.

Correspondingly, one embodiment of the present application further provides a manufacturing method of the display panel. The method includes:

providing a base substrate;

forming a thin film transistor layer on the base substrate, wherein the thin film transistor layer includes an auxiliary electrode;

forming a planarization layer on the thin film transistor layer, forming a first opening in the planarization layer, and making the first opening to expose the auxiliary electrode;

forming an anode layer on the planarization layer, processing the anode layer to form an anode and a connection portion spaced apart, and making the connection portion to be electrically connected to the auxiliary electrode, wherein on a lateral surface of the connection portion facing toward the anode, a first protruding portion protrudes toward the anode; a gap is between the first protruding portion and the planarization layer to form an undercut structure, forming a cathode layer on a side of the anode layer facing away the base substrate, and making the cathode layer extend into the undercut structure and be electrically connected to the connection portion.

Optionally, in some embodiments of the present application, forming the anode layer on the planarization layer and processing the anode layer to form the anode and the connection portion spaced apart include:

forming a linking layer, a reflection layer, and an electrode layer on the planarization layer sequentially, wherein the linking layer, the reflection layer, and the electrode layer form the anode layer;

etching the electrode layer to form a first electrode portion and a second electrode portion;

etching the reflection layer to form a first reflection portion and a second reflection portion, making the first electrode portion to protrude from a lateral surface of the first reflection portion facing toward the second reflection portion to form a first protruding portion, etching the linking layer to form a first linking portion and a second linking portion, making the first linking portion to protrude from a lateral surface of the first reflection portion facing toward the second reflection portion to form a second protruding portion, wherein the first linking portion, the first reflection portion, and the first electrode portion form the connection portion, and the second linking portion, the second reflection portion, and the second electrode portion form the anode.

Optionally, in some embodiments of the present application, forming the linking layer, the reflection layer, and the electrode layer on the planarization layer sequentially includes:

depositing to form the linking layer and the reflection layer on the planarization layer sequentially;

performing a vacuum oxidation process on the linking layer and the reflection layer; and depositing to form the electrode layer on the reflection layer.

Optionally, in some embodiments of the present application, a material of the electrode layer includes indium tin oxide or indium zinc oxide, and etching the electrode layer includes:

adopting oxalic acid to etch the electrode layer.

Optionally, in some embodiments of the present application, a material of the reflection layer includes an alloy of aluminum, nickel, copper, and lanthanum, and etching the reflection layer includes:

adopting aluminum hydroxide to etch the reflection layer.

Optionally, in some embodiments of the present application, a material of the linking layer includes molybdenum or an alloy of molybdenum, titanium, and nickel, and etching the linking layer includes:

adopting aluminum hydroxide to etch the linking layer.

Optionally, in some embodiments of the present application, the reflection layer and the linking layer are etched simultaneously.

Optionally, in some embodiments of the present application, an etching rate of the linking layer is less than an etching rate of the reflection layer.

Optionally, in some embodiments of the present application, the method further includes:

performing a heat treatment on the first electrode portion and the second electrode portion.

The display panel in the embodiments of the present application includes the base substrate, the thin film transistor layer, the planarization layer, the anode layer, and the cathode layer disposed sequentially. The thin film transistor layer includes the auxiliary electrode. The anode layer includes the anode and the connection portion spaced apart. The connection portion is electrically connected to the auxiliary electrode. On the lateral surface of the connection portion facing toward the anode, a first protruding portion protrudes toward the anode. The first protruding portion and the planarization layer form the undercut structure. The cathode layer extends into the undercut structure and is electrically connected to the connection portion. In the present application, through the first protruding portion protruding on the lateral surface of the connection portion facing toward the anode, the cathode layer can be cut off at an edge of the first protruding portion and extends to a bottom of the first protruding portion to link to the connection portion by adjusting angles of evaporation deposition or sputtering, thereby realizing electrical connection between the cathode layer and the auxiliary electrode, so as to improve display uniformity of the display panel. Additionally, as the undercut structure is directly formed on the connection portion of the anode layer, the undercut structure can be formed simultaneously when a patterned process is performed on the anode layer, thereby reducing a number of photomasks and reducing production cost.

DESCRIPTION OF DRAWINGS

To more clearly illustrate the technical solutions of the embodiments of the present application, the accompanying figures of the present application will be described in brief. Obviously, the accompanying figures described below are only part of the embodiments of the present application, from which figures those skilled in the art can derive further figures without making any inventive efforts.

DESCRIPTION OF REFERENCE NUMBERS OF ACCOMPANYING FIGURES

Figure 1:
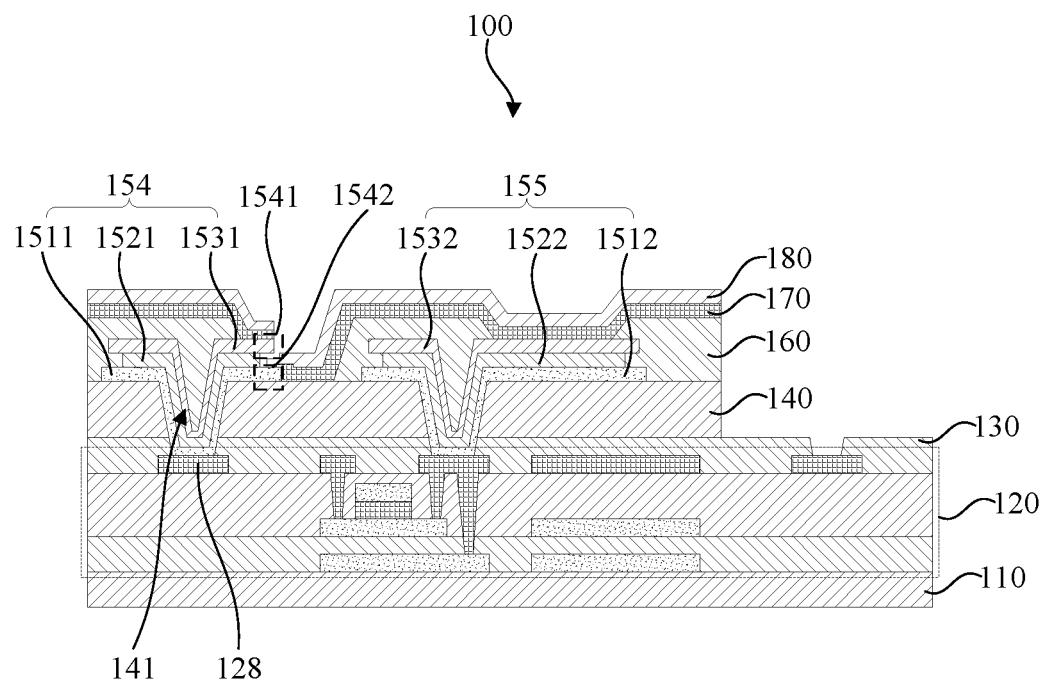
FIG. 1 is a structural schematic diagram of a display panel provided by one embodiment of the present application.

| reference number | element name |
|---|---|
| 10 | display device |
| 100 | display panel |
| 110 | base substrate |
| 120 | thin film transistor layer |
| 121 | light-shielding layer |
| 122 | buffer layer |
| 123 | active layer |
| 124 | gate insulation layer |
| 125 | gate electrode layer |
| 126 | interlayer dielectric layer |
| 127 | source-drain layer |
| 128 | auxiliary electrode |
| 130 | passivation layer |
| 140 | planarization layer |
| 141 | first opening |
| 150 | anode layer |
| 151 | linking layer |
| 1511 | first linking portion |
| 1512 | second linking portion |
| 152 | reflection layer |
| 1521 | first reflection portion |
| 1522 | second reflection portion |
| 153 | electrode layer |
| 1531 | first electrode portion |
| 1532 | second electrode portion |
| 154 | connection portion |
| 1541 | first protruding portion |
| 1542 | second protruding portion |
| 155 | anode |
| 160 | pixel definition layer |
| 170 | light-emitting layer |
| 180 | cathode layer |
| 200 | control circuit |
| 300 | housing |

DETAILED DESCRIPTION OF EMBODIMENTS

The technical solutions in the embodiments of the present application are clearly and completely described in the following with reference to the accompanying drawings in the embodiments of the present application. Obviously, the described embodiments are only part of the embodiments of the present application, but are not all embodiments of the present application. All other embodiments obtained by those skilled in the art based on the embodiments of the present application without creative efforts are within the scope of the present application. Besides, it should be understood that the specific embodiments described herein are merely for describing and explaining the present application and are not intended to limit the present application. In the present application, unless opposite stated, the orientation words used such as "upper" and "lower" generally refer to the upper and lower directions of the device in actual using or working state, and specifically refer to the drawing directions in the drawings, and "inner" and "outer" refer to the outline of the device.

Embodiments of the present application provide a display panel, a display device, and a manufacturing method of the display panel. The details are described below. It should be noted that a description order of the following embodiments is not intended to limit a preferred order of the embodiments.

Firstly, one embodiment of the present application provides a display panel. As illustrated in FIG. 1, the display panel 100 includes a base substrate 110. The base substrate 110 acts as a support structure for the display panel 100 and is configured to support other functional structural layers disposed on the base substrate 110 to ensure structural stability of the display panel 100. Wherein, the base substrate 110 can be a glass substrate or other material types, which is not limited herein.

The display panel 100 includes a thin film transistor layer 120. The thin film transistor layer 120 is disposed on the base substrate 110. The thin film transistor layer 120 acts as a switch control structure of the display panel 100 and is configured to control light-emitting manners of light-emitting pixels in the display panel 100 to realize different display requirements of the display panel 100. The thin film transistor layer 120 includes the auxiliary electrode 128. The auxiliary electrode 128 is configured to connect to a subsequent film layer to reduce a internal resistance of a corresponding region of the display panel 100, thereby reducing a voltage drop due to the internal resistance and improving the display uniformity of the display panel 100.

Figure 5:
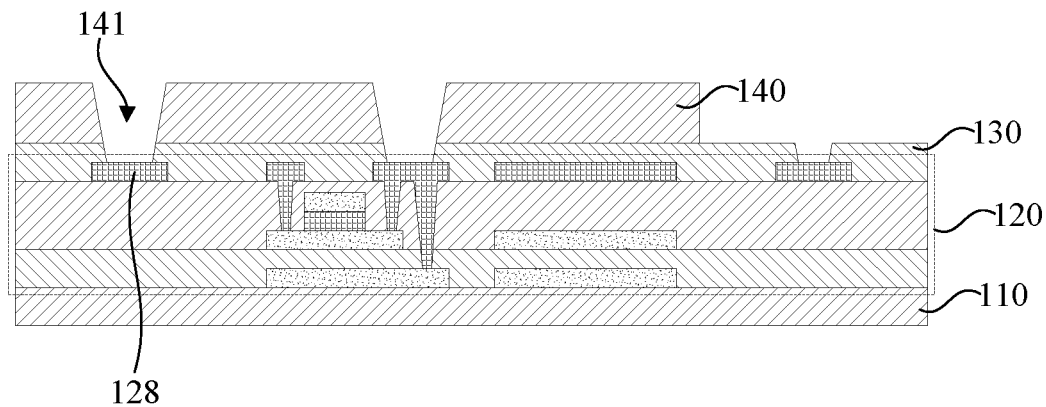
FIG. 5 is a structural schematic diagram of step S300 in FIG. 3 provided by one embodiment of the present application.

The display panel 100 includes a planarization layer 140. The planarization layer 140 is disposed on the thin film transistor layer 120, and is configured to perform a planarization process on a surface of the thin film transistor layer 120, so as to facilitate manufacture of the subsequent film layer. As illustrated in FIG. 5, a first opening 141 is defined at a position corresponding to the auxiliary electrode 128 in the planarization layer 140, and the first opening 141 exposes the auxiliary electrode 128, so as to facilitate the connection design between the subsequent film layer and the auxiliary electrode 128.

Figure 8:
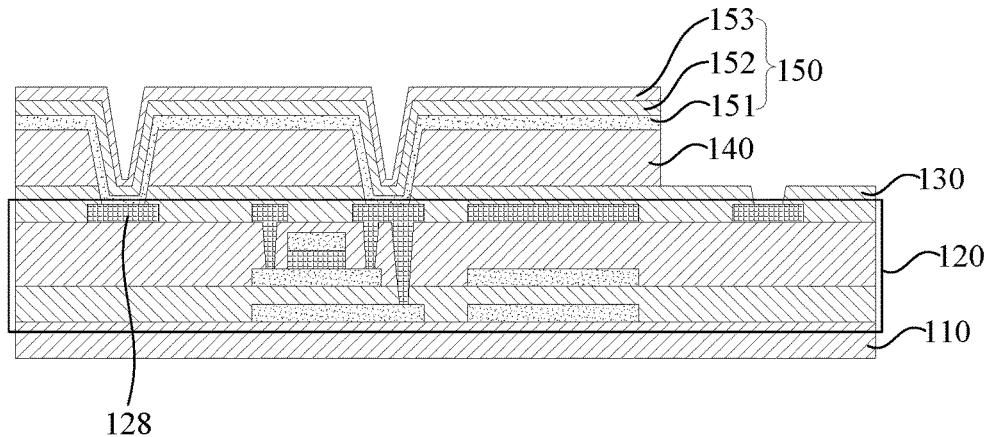
FIG. 8 is a structural schematic diagram of step S410 in FIG. 7 provided by one embodiment of the present application.

As illustrated in FIG. 1 and FIG. 8, the display panel 100 includes an anode layer 150. The anode layer 150 is disposed on a side of the planarization layer 140 facing away the base substrate 110. The anode layer 150 includes the anode 155 and the connection portion 154 spaced apart. The anode 155 acts as a control electrode of the light-emitting pixels in the display panel 100. The light-emitting manners of the light-emitting pixel in the display panel 100 can be controlled by turning on and turning off a signal in the anode 155. The connection portion 154 is electrically connected to the auxiliary electrode 128. When the subsequent film layer is manufactured, electrical connection between the subsequent film layer and the auxiliary electrode 128 can be realized through connection design of the subsequent film layer and the connection portion 154.

Wherein, on the lateral surface of the connection portion 154 facing toward the anode 155, a first protruding portion 1541 protrudes toward the anode 155, and a gap is between the first protruding portion 1541 and the planarization layer 140, i.e., the first protruding portion 1541 and the planarization layer 140 form an undercut structure. When the subsequent film layer is manufactured, the first protruding portion 1541 can interrupt the subsequent film layer, so that the subsequent film layer is cut off at an edge of the first protruding portion 1541. Meanwhile, by defining the gap between the first protruding portion 1541 and the planarization layer 140, when the subsequent film layer is manufactured, the subsequent film layer can extend to a bottom of the first protruding portion 1541 and links to the connection portion 154 by adjusting angles of evaporation deposition or sputtering. Therefore, electrical connection between the subsequent film layer and the auxiliary electrode 128 is realized, so that display uniformity of the display panel 100 is improved.

It should be noted that the first protruding portion 1541 is a part of the connection portion 154 in the anode layer 150, i.e., the undercut structure is directly formed on the connection portion 154 of the anode layer 150, so that the undercut structure can be simultaneously formed but does not need to be manufactured independently when a patterning process is performed on the anode layer 150, thereby simplifying manufacturing processes of the undercut structure in the display panel 100, reducing a number of photomasks, and reducing the manufacturing cost of the display panel 100.

The display panel 100 further includes a cathode layer 180. The cathode layer 180 is disposed on a side of the anode layer 150 facing away the base substrate 110. The cathode layer 180 extends into the undercut structure and is electrically connected to the connection portion 154. That is, when the cathode layer 180 is manufactured, by adjusting the angles of evaporation deposition or sputtering, the cathode layer 180 is made to cut off at the edge of the first protruding portion 1541. The cathode layer 180 extends to the bottom of the first protruding portion 1541 and is linked to the connection portion 154, so as to realize the electrical connection between the cathode layer 180 and the auxiliary electrode 128.

When the display panel 100 is manufactured, in order to ensure the display panel 100 has a sufficient light transmittance rate, a thickness of the cathode layer 180 needs to be reduced. Therefore, an internal resistance of the surface of the cathode layer 180 is relatively large, resulting in voltage drop due to internal resistance being serious, thereby leading to the display panel 100 having an uneven display problem, which seriously affects the display effect of the display panel 100. By disposing the auxiliary electrode 128, the cathode layer 180 can be electrically connected to the auxiliary electrode 128, which can reduce the internal resistance of the corresponding area of the display panel 100, thereby reducing effect from the voltage drop due to the internal resistance, improving the display uniformity of the display panel 100, and improving display effect of the display panel 100.

In the embodiments of the present application, the display panel 100 includes the base substrate 110, the thin film transistor layer 120, the planarization layer 140, the anode layer 150, and the cathode layer 180 disposed sequentially. The thin film transistor layer 120 includes the auxiliary electrode 128. The anode layer 150 includes the anode 155 and the connection portion 154 spaced apart. The connection portion 154 is electrically connected to the auxiliary electrode 128. On the lateral surface of the connection portion 154 facing toward the anode 155, the first protruding portion 1541 protrudes toward the anode 155, and the first protruding portion 1541 and the planarization layer 140 form the undercut structure. The cathode layer 180 extends into the undercut structure and is electrically connected to the connection portion 154. In the present application, through the first protruding portion 1541 protruding on the lateral surface of the connection portion 154 facing toward the anode 155, the cathode layer 180 can be cut off at the edge of the first protruding portion 1541 and extends to the bottom of the first protruding portion 1541 to link to the connection portion 154 by adjusting the angles of evaporation deposition or sputtering, thereby realizing electrical connection between the cathode layer 180 and the auxiliary electrode 128, so as to improve display uniformity of the display panel 100. Additionally, as the undercut structure is directly formed on the connection portion 154 of the anode layer 150, the undercut structure can be formed simultaneously when a patterned process is performed on the anode layer 150, thereby reducing a number of photomasks and reducing production cost.

Optionally, on a lateral surface of the connection portion 154 facing toward the anode 155, a second protruding portion 1542 further protrudes toward the anode 155, the second protruding portion 1542 and the first protruding portion 1541 are spaced apart along a direction away from the base substrate 110, i.e., the second protruding portion 1542 is located on the planarization layer 140; and the first protruding portion 1541 is located on a side of the second protruding portion 1542 away from the planarization layer 140, and a gap is reserved between the first protruding portion 1541 and the second protruding portion 1542, i.e., the first protruding portion 1541 and the second protruding portion 1542 form an undercut structure.

This structural design allows the cathode layer 180 can be interrupted by the first protruding portion 1541 when the cathode layer 180 is manufactured, so that the cathode layer 180 is cut off at the edge of the first protruding portion 1541. By adjusting the angles of evaporation deposition or sputtering, when the cathode layer 180 extends to the bottom of the first protruding portion 1541, it can be directly connected to the second protruding portion 1542, so as to realize the electrical connection to the auxiliary electrode 128, thereby simplifying the electrical connection manner between the cathode layer 180 and the auxiliary electrode 128 and improving the effect of the electrical connection between the cathode layer 180 and the auxiliary electrode 128.

Optionally, the connection portion 154 includes a first linking portion 1511, a first reflection portion 1521, and a first electrode portion 1531 disposed in a stack along the direction away from the base substrate 110. The first linking portion 1511 is electrically connected to the auxiliary electrode 128 to realize electrical connection of the connection portion 154 and the auxiliary electrode 128. Meanwhile, the first linking portion 1511 is configured to insulate from moisture in the planarization layer 14. The moisture is prevented from entering into the first reflection portion 1521 to affect the structural stability of the first reflection portion 1521. The first reflection portion 1521 is configured to reflect an external ambient light, so as to prevent the external ambient light from directly irradiating to inside of the display panel 100 and affecting the display effect of the display panel 100.

Wherein, the first linking portion 1511 protrudes on a lateral surface of the first reflection portion 1521 facing toward the anode 155 to form the second protruding portion 1542, and the first electrode portion 1531 protrudes on a lateral surface of the first reflection portion 1521 facing toward the anode 155 to form the first protruding portion 1541. By configuring the connection portion 154 to be a three-layer structure, and by using difference of properties of the three-layer structure, when the patterning process is performed on the anode layer 150, the first protruding portion 1541 and the second protruding portion 1542 can be formed at the same time during the patterning process by adjusting an etching process, so as to form the undercut structure on the connection portion 154, which is facilitate to reducing the number of the photomasks and reducing production cost.

Optionally, an orthogonal projection of the first protruding portion 1541 on the base substrate 110 at least partially overlaps with an orthogonal projection of the second protruding portion 1542 on the base substrate 110. That is, in a thickness direction of the base substrate 110, the first protruding portion 1541 at least partially shield the second protruding portion 1542, which is beneficial to adjust coverage extent of the cathode layer 180 on the surface of the second protruding portion 1542 by adjusting the angles of evaporation deposition or sputtering in the manufacturing process of the cathode layer 180. Therefore, linking effect between the cathode layer 180 and the connection portion 154 is beneficially improved, thereby reducing the voltage drop due to the internal resistance in the corresponding region of the display panel 100 and improving the display effect of the display panel 100.

It should be noted that overlapping extent of the orthogonal projection of the first protruding portion 1541 on the base substrate 110 and the orthogonal projection of the second protruding portion 1542 on the base substrate 110 can be adjusted and designed according to the adjustment range of the angles of evaporation deposition or sputtering, which only needs to ensure effective link between the cathode layer 180 and the connection portion 154 to realize the electrical connection between the cathode layer 180 and the auxiliary electrode 128.

Optionally, in one embodiment of the present application, the anode 155 includes a second linking portion 1512, a second reflection portion 1522, and a second electrode portion 1532 disposed in a stack along the direction away from the base substrate 110. The thin film transistor layer 120 includes a source-drain layer 127. The second linking portion 1512 is configured to be electrically connected to the source-drain layer 127 to realize electrical connection between the anode 155 and the source-drain layer 127. Meanwhile, the second linking portion 1512 is configured to insulate from the moisture in the planarization layer 140. The moisture is prevented from entering into the second reflection portion 1522 to affect the structural stability of the second reflection portion 1522. The second reflection portion 1522 is configured to reflect an external ambient light, so as to prevent the external ambient light from directly irradiating to inside of the display panel 100 and affecting the display effect of the display panel 100. The second electrode portion 1532 is configured to be electrically connected to the light-emitting pixels, so as to realize the anode 155 controlling the light-emitting manner of the light-emitting pixel, thereby realizing the control of the display manner of the display panel 100.

Optionally, the first electrode portion 1531 includes indium tin oxide or indium zinc oxide, i.e., the first electrode portion part 1531 is a transparent electrode, so that application of the display panel 100 in a top emission display is realized, and the first electrode portion can be etched by oxalic acid. The first reflection portion 1521 includes an alloy of aluminum, nickel, copper, and lanthanum, the first linking portion 1511 includes molybdenum or an alloy of molybdenum, titanium, and nickel, i.e., the first reflection portion 1521 and the first linking portion 1511 can be etched by aluminum hydroxide. However, the etching rates of the first reflection portion 1521 and the first linking portion 1511 in the aluminum hydroxide are different. Compared to the first linking portion 1511, the etching rate of the first reflection portion 1521 in the aluminum hydroxide is faster. Therefore, the first linking portion 1511 is allowed to protrude on the lateral surface of the first reflection portion 1521 facing toward the anode 155 to form the second protruding portion 1542. That is, the undercut structure can be formed on the connection portion 154 while the patterning process is performed on the anode layer 150 by using an etching solution, thereby reducing the number of the photomasks and production costs.

It should be noted that in one embodiment of the present application, the first electrode portion 1531, the first reflection portion 1521, and the first linking portion 1511 are not limited to the aforesaid materials. When the materials of the first electrode portion 1531, the first reflection portion 1521, and the first linking portion 1511 are changed, corresponding used etching solutions are also changed. It only needs to ensure that during the patterning process being performed on the anode layer 150 by using the etching solution, the first electrode portion 1531 protrudes on the lateral surface of the first reflection portion 1521 facing toward the anode 155 to form the first protruding portion 1541, and the first linking portion 1511 protrudes on the lateral surface of the first reflection portion 1521 facing toward the anode 155 to form the second protruding portion 1542, which are not specially limited herein.

Wherein, materials of the second linking portion 1512 and the first linking portion 1511 are same, materials of the second reflection portion 1522 and the first reflection portion 1521 are same, and materials of the second electrode portion 1532 and the first electrode portion 1531 are same. That is, the second linking portion 1512 and the first linking portion 1511 are disposed in a same layer, the second reflection portion 1522 and the first reflection portion 1521 are disposed in a same layer, the second electrode portion 1532 and the first electrode portion 1531 are disposed in a same layer, and a structure of the connection portion 154 and a structure of the anode 155 are simultaneously formed when the patterning process is performed on the anode layer 150.

That is, when the patterning process is performed on the anode layer 150, the second electrode portion 1532 protrudes on a lateral surface of the second reflection portion 1522 facing toward the connection portion 154 to form a third protruding portion, and the second linking portion 1512 protrudes on a lateral surface of the second reflection portion 1522 facing toward the connection portion 154 to form a fourth protruding portion. This structural design allows a configured position of the auxiliary electrodes 128 can be adjusted according to distribution of the voltage drop due to the internal resistance in each region of the display panel 100 when the display panel 100 is manufactured. Therefore, adjustment of a configured position of the connection portion 154 only needs to adjust an etching position according to requirements when the patterning process is performed on the anode layer 150, so that a configured position of the undercut structure in the display panel 100 is more flexible and convenient.

Wherein, after the patterning process of the anode layer 150 is completed, heat treatment can be performed on the first electrode portion 1531 and the second electrode portion 1532 to densify crystals of the first electrode portion 1531 and the second electrode portion 1532. Therefore, structural strength the first electrode portion 1531 and the second electrode portion 1532 is improved, which can prevent the first electrode portion 1531 and the second electrode portion 1532 from collapsing during manufacturing or usage.

Optionally, the thin film transistor layer 120 includes a light-shielding layer 121, a gate electrode layer 125, and a source-drain layer 127. When the thin film transistor layer 120 is formed, the auxiliary electrode 128 can be disposed in a same layer with one of the source-drain layer 127, the gate electrode layer 125, or the light-shielding layer 121. That is, the auxiliary electrode 128 and a metal layer in the thin film transistor layer 120 are disposed in a same layer, so that the auxiliary electrode 128 can be formed while the patterning process is performed on the metal layer in the thin film transistor layer 120, thereby simplifying manufacturing processes of the display panel 100, improving production efficiency, and reducing production cost.

Optionally, the display panel 100 further includes a pixel definition layer 160. The pixel definition layer 160 is disposed on the planarization layer 140 and the anode layer 150. A pixel opening is defined in the pixel definition layer 160 and is configured to define positions of the light-emitting pixels. The pixel opening exposes a part of the anode 155 and is used for connection of a subsequent film layer and the anode 155. Additionally, a second opening is further defined in the pixel definition layer 160. The second opening exposes the first protruding portion 1541 and the second protruding portion 1542 of the connection portion 154, so that when the cathode layer 180 is manufactured, the cathode layer 180 can be cut off at the edge of the first protruding portion 1541 and is linked to the second protruding portion 1542 simultaneously, thereby realizing the electrical connection between the cathode layer 180 and the auxiliary electrode 128.

The display panel 100 includes a light-emitting layer 170. The light-emitting layer 170 is disposed on the pixel definition layer 160 and the anode layer 150, and the light-emitting layer 170 partially covers the second protruding portion 1542. When the light-emitting layer 170 is manufactured, the first protruding portion 1541 can interrupt the light-emitting layer 170, so that the light-emitting layer 170 is cut off at an edge of the first protruding portion 1541. By adjusting an evaporation deposition angle of the light-emitting layer 170, the light-emitting layer 170 can only cover a part of the second protruding portion 1542 to prevent link between the cathode layer 180 and the second protruding portion 1542 from being affected.

Wherein, the cathode layer 180 is disposed on the light-emitting layer 170, and the cathode layer 180 covers the light-emitting layer 170 and is electrically connected to the second protruding portion 1542. That is, when the cathode layer 180 is manufactured, by adjusting the angles of evaporation deposition or sputtering, the cathode layer 180 is allowed to fully cover the light-emitting layer 170 and extends to the bottom of the first protruding portion 1541, so that the cathode layer 180 is allowed to be linked to the second protruding portion 1542, thereby realizing the electrical connection between the cathode layer 180 and the auxiliary electrode 128.

Secondly, one embodiment of the present application further provides a display device. The display device includes the display panel. Specific structures of the display panel can refer to the aforesaid embodiments. Because all the technical solutions of the aforesaid embodiments are adopted in the display device, the display device has at least all the beneficial effects from the technical solutions of the aforesaid embodiments. Redundant description will not be mentioned herein again.

Figure 2:
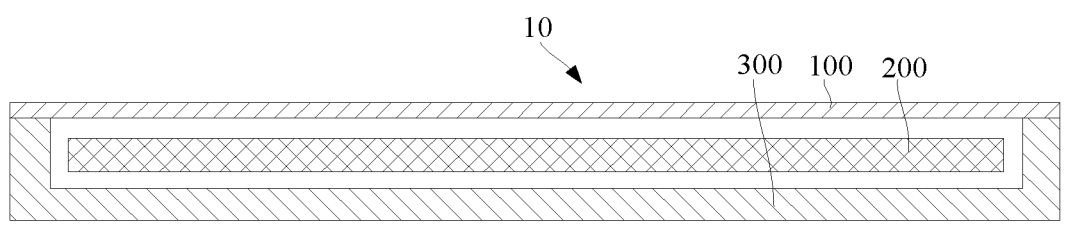
FIG. 2 is a structural schematic diagram of a display device provided by one embodiment of the present application.

As illustrated in FIG. 2, the display device 10 includes a display panel 100, a control circuit 200, and a housing 300. Wherein, the housing 300 is connected to the display panel 100 to support and fix the display panel 100, the control circuit 200 is disposed in the housing 300, and the control circuit 200 is electrically connected to the display panel 100 to control the display panel to display images.

Wherein, the display panel 100 can be fixed to the housing 300 and can form in one piece with the housing 300, and an enclosed space formed by the display panel 100 and the housing 300 is configured to accommodate the control circuit 200. The control circuit 200 can be a main board of the display device 10. Meanwhile, the control circuit 200 can also be integrated with one or more functional components such as a battery, an antenna structure, a microphone, a speaker, a headphone port, a universal serial bus interface, a camera, a distance sensor, an ambient light sensor, and a processor, so as to enable the display device 10 can be adapted to various application fields.

It should be noted that the display device 10 is not limited to the aforesaid contents, it can also include other devices, such as a camera, an antenna structure, a fingerprint unlocking module, etc., to expand its usage scope, and it is not limited herein.

It should be noted that, in the embodiments of the present application, an application range of the display device 10 is wide. The display device 10 includes a flexible display or a lighting device such as a television, a computer, a mobile phone, or a foldable or rollable display, etc., or a wearable device such as a smart bracelet, a smart watch, etc., all of them are within the scope of the application field to which the display device 10 in the embodiment of the present application belongs.

Figure 3:
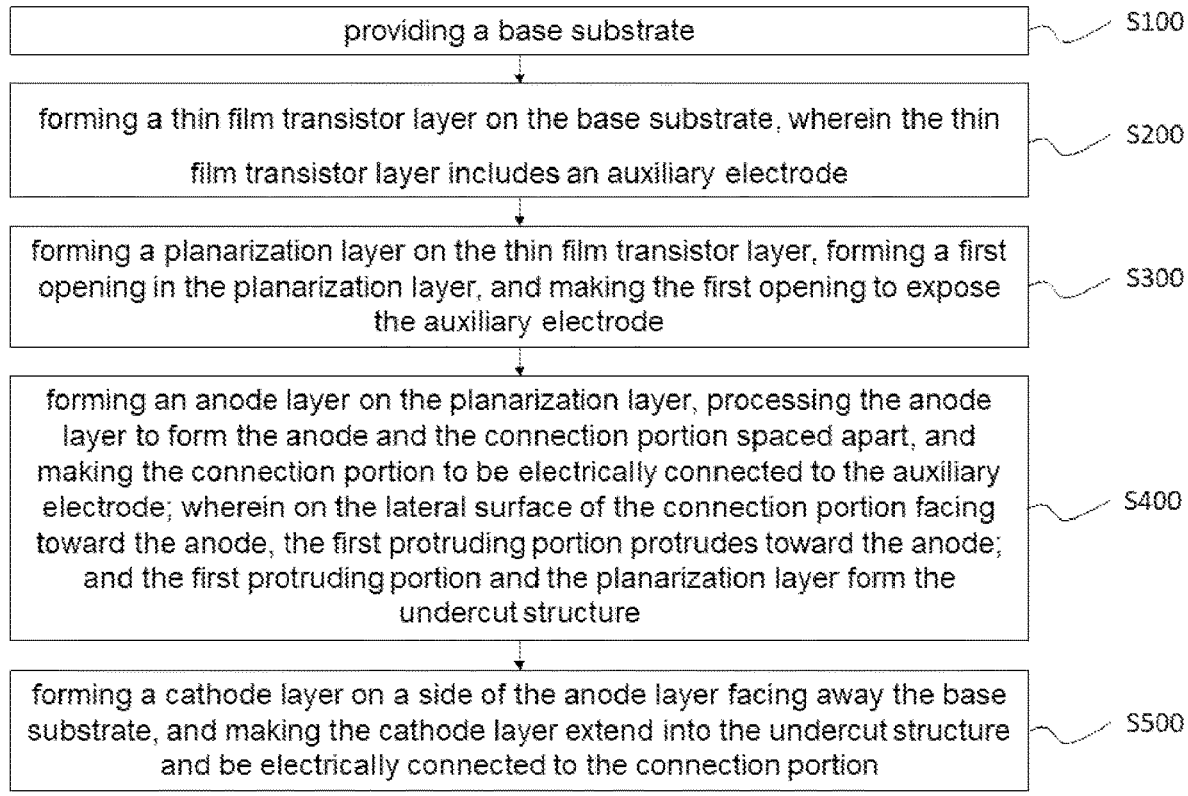
FIG. 3 is a flowchart of a manufacturing method of the display panel provided by one embodiment of the present application.

Finally, one embodiment of the present application further provides a manufacturing method of the display panel, which can be used to manufacture the display panel 100 in the aforesaid embodiments. As illustrated in FIG. 3, the manufacturing method of the display panel mainly includes the following steps.

S100: providing a base substrate 100.

When the display panel 100 is manufactured, the base substrate 110 needs to be provided at first, and the base substrate 110 needs to be cleaned to remove stains on a surface of the base substrate 110, which facilitates to manufacture a subsequent film layer. The base substrate 110 acts as a support structure for the display panel 100 and is configured to support other functional structural layers disposed on the base substrate 110 to ensure structural stability of the display panel 100. Wherein, the base substrate 110 can be a glass substrate or other material types, which is not limited herein.

S200: forming a thin film transistor layer 120 on the base substrate 110, wherein the thin film transistor layer 120 includes an auxiliary electrode 128.

Figure 4:
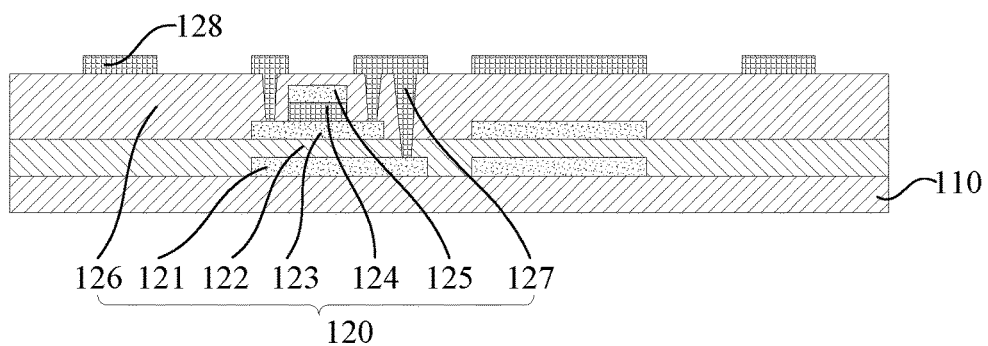
FIG. 4 is a structural schematic diagram of step S200 in FIG. 3 provided by one embodiment of the present application.

As illustrated in FIG. 4, after the base substrate 110 is completely prepared, the thin film transistor layer 120 is formed on the base substrate 110. The thin film transistor layer 120 acts as a switch control structure of the display panel 100 and is configured to control light-emitting manners of light-emitting pixels in the display panel 100 to realize different display requirements of the display panel 100. The auxiliary electrode 128 is disposed in the thin film transistor layer 120. The auxiliary electrode 128 is configured to connect to a subsequent film layer to reduce a internal resistance of a corresponding region of the display panel 100, thereby reducing a voltage drop due to the internal resistance and improving the display uniformity of the display panel 100.

Wherein, the thin film transistor layer 120 includes a plurality layers of metal layers. When the thin film transistor layer 120 is manufactured, the auxiliary electrode 128 and the metal layer in the thin film transistor layer 120 can be disposed in a same layer, so as to simplify manufacturing processes of the display panel 100, to improve the production efficiency, and to reduce the production cost. Specifically, when the thin film transistor layer 120 is formed, the following steps are mainly included.

First, depositing a light-shielding layer 121 on the base substrate 110 to shield an external ambient light, so as to prevent the external ambient light from directly irradiating to inside of the thin film transistor layer 120 and affecting the structural stability of the thin film transistor layer 120. Wherein, a material of the light-shielding layer 121 includes one of molybdenum, titanium, copper, manganese, or an alloy, which is not limited herein.

Depositing a layer of buffer layer 122 on the light-shielding layer 121, wherein the buffer layer 122 can be a single-layer structure or a multi-layer structure, and a material of the buffer layer 122 can include one or more of silicon oxide, silicon nitride, or silicon oxynitride. The buffer layer 122 is mainly configured to insulate the light-shielding layer 121 from the subsequent film layer, so as to prevent mutual interference between the light shielding layer 121 and the subsequent film layer, and also can prevent impurity ions in the base substrate 110 from entering into the subsequent film layer.

The active layer 123, the gate insulation layer 124, and the gate layer 125 are sequentially deposited on the buffer layer 122, and then a patterning process is performed. A metal oxide semiconductor material is adopted in the active layer 123, which includes indium gallium zinc oxide (IGZO), indium zinc tin oxide (IZTO), or indium gallium zinc tin oxide (IGZTO), etc. The active layer 123 is disposed corresponding to the patterned light-shielding layer 121 after a patterning process. A gate insulation layer 124 can be a single-layer structure or a multi-layer structure. A material of the gate insulation layer 124 includes one or more of silicon oxide, silicon nitride, or silicon oxynitride. A material of the gate electrode layer 125 includes one of molybdenum, titanium, copper, or an alloy.

When the gate electrode layer 125 and the gate insulation layer 124 are etched, a photolithography process is used to pattern the gate electrode layer 125 first. Then, the patterned gate electrode layer 125 acts as a mask plate, and the gate insulation layer 124 is etched, so that the gate insulation layer 124 is only located under the patterned gate electrode layer 125, and the gate insulation layer 124 in other region is completely removed. After that, a plasma treatment of the entire surface is performed, so a resistance of a region corresponding to the exposed active layer 123 is significantly reduced to form a conductor layer, while semiconductor characteristics are maintained in regions of the active layer 123 shielded by the gate insulation layer 124 and the gate electrode layer 125, thereby forming a conductive channel.

Next, continuously depositing to form the interlayer dielectric layer 126, and forming contact holes by etching the interlayer dielectric layer 126 to facilitate connection between the subsequent film layer and the active layer 123. The interlayer dielectric layer 126 can be a single-layer structure or a multi-layer structure. A material of the interlayer dielectric layer 126 includes one or more of silicon oxide, silicon nitride, or silicon oxynitride. Then, a layer of a source-drain layer 127 is deposited on the interlayer dielectric layer 126, and a source electrode, a drain electrode, the auxiliary electrode 128, and connection terminals are simultaneously formed by a patterning process, thereby completing manufacture of the thin film transistor layer 120.

Wherein, the auxiliary electrode 128 and the source-drain electrode are disposed in a same layer, which facilitates to shorten a connection distance between the auxiliary electrode 128 and the subsequent anode layer 150, thereby reducing an opening depth and reducing a fragmentation risk due to raise of the anode layer 150. A material of the source-drain layer 127 includes one of molybdenum, titanium, copper, manganese, or an alloy, which is not limited herein.

After the thin film transistor layer 120 is manufactured, a layer of passivation layer 130 can be deposited on a surface of the thin film transistor layer 120 to protect the source-drain layer 127. The passivation layer 130 can be a single-layer structure or a multi-layer structure. A material of the passivation layer 130 includes one or more of silicon oxide, silicon nitride, or silicon oxynitride.

S300: forming a planarization layer 140 on the thin film transistor layer 120, forming a first opening 141 in the planarization layer 140, and making the first opening 141 to expose the auxiliary electrode 128.

As illustrated in FIG. 5, after the thin film transistor layer 120 is manufactured completely, the planarization layer 140 is manufactured on the thin film transistor layer 120, and is configured to perform a planarization process on a surface of the thin film transistor layer 120, so as to facilitate manufacture of subsequent film layer. A first opening 141 is defined at a position corresponding to the auxiliary electrode in the planarization layer 140, and the first opening 141 exposes the auxiliary electrode 128, so as to facilitate the connection design between the subsequent film layer and the auxiliary electrode 128.

Wherein, the planarization layer 140 can be a single-layer structure or a multi-layer structure. A specific configuration method of the planarization layer 140 can be adjusted according to a planarization effect of the planarization layer 140, so as to ensure flatness of the surface of the thin film transistor layer 120 after planarizing and to improve thickness uniformity of the subsequent film layer.

S400: forming an anode layer 150 on the planarization layer 140, processing the anode layer 150 to form the anode 155 and the connection portion 154 spaced apart, and making the connection portion 154 to be electrically connected to the auxiliary electrode 128; wherein on the lateral surface of the connection portion 154 facing toward the anode 155, the first protruding portion 1541 protrudes toward the anode 155; and the first protruding portion 1541 and the planarization layer 140 form the undercut structure.

Figure 6:
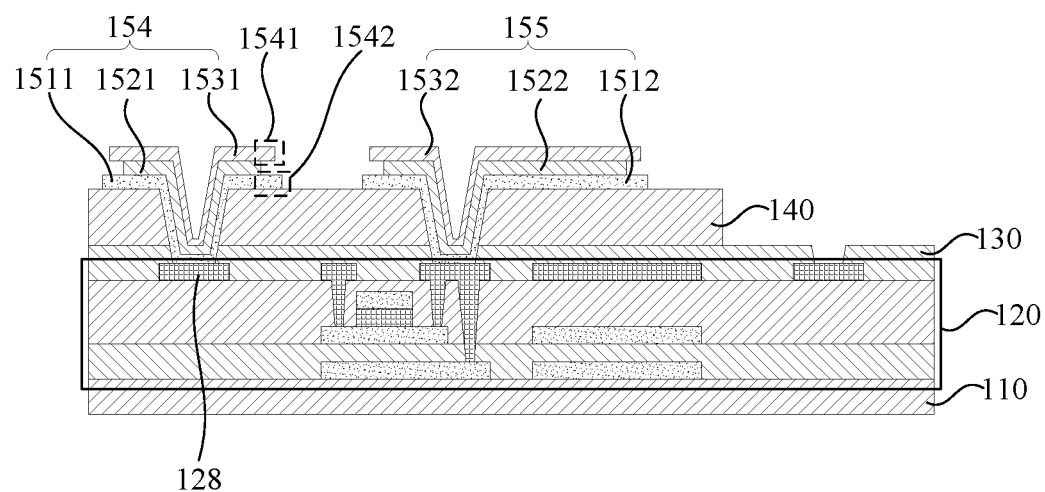
FIG. 6 is a structural schematic diagram of step S400 in FIG. 3 provided by one embodiment of the present application.

As illustrated in FIG. 6, after the planarization layer 140 is manufactured completely, the anode layer 150 is deposited and formed on the surface of the planarization layer 140, and the anode layer 150 is etched by an etching solution to form the anode 155 and the connection portion 154 spaced apart. The anode 155 acts as a control electrode of the light-emitting pixels in the display panel 100. The light-emitting manners of the light-emitting pixel in the display panel 100 can be controlled by turning on and turning off a signal in the anode 155. The connection portion 154 is electrically connected to the auxiliary electrode 128. When the subsequent film layer is manufactured, electrical connection between the subsequent film layer and the auxiliary electrode 128 can be realized through connection design of the subsequent film layer and the connection portion 154.

Wherein, on the lateral surface of the connection portion 154 facing toward the anode 155, a first protruding portion 1541 protrudes toward the anode 155, and a gap is between the first protruding portion 1541 and the planarization layer 140, i.e., the first protruding portion 1541 and the planarization layer 140 form an undercut structure. When the subsequent film layer is manufactured, the first protruding portion 1541 can interrupt the subsequent film layer, so that the subsequent film layer is cut off at an edge of the first protruding portion 1541. Meanwhile, by defining the gap between the first protruding portion 1541 and the planarization layer 140, when the subsequent film layer is manufactured, the subsequent film layer can extend to a bottom of the first protruding portion 1541 and links to the connection portion 154 by adjusting angles of evaporation deposition or sputtering. Therefore, electrical connection between the subsequent film layer and the auxiliary electrode 128 is realized, so that display uniformity of the display panel 100 is improved.

It should be noted that the first protruding portion 1541 is a part of the connection portion 154 in the anode layer 150, i.e., the undercut structure is directly formed on the connection portion 154 of the anode layer 150, so that the undercut structure can be simultaneously formed but does not need to be manufactured independently when a patterning process is performed on the anode layer 150, thereby simplifying manufacturing processes of the undercut structure in the display panel 100, reducing a number of photomasks, and reducing the manufacturing cost of the display panel 100.

S500: forming a cathode layer 180 on a side of the anode layer 150 facing away the base substrate 110, and making the cathode layer 180 extend into the undercut structure and be electrically connected to the connection portion 154.

After the anode layer 150 is manufactured completely, the cathode layer 180 can be formed on the side of the anode layer 150 facing away the base substrate 110 by an evaporation deposition method or a sputtering method. Through the mutual effect of the anode layer 150 and the cathode layer 180, control of the display manner of the display panel 100 can be realized. That is, when the cathode layer 180 is manufactured, by adjusting the angles of evaporation deposition or sputtering, the cathode layer 180 can be cut off at the edge of the first protruding portion 1541. The cathode layer 180 extends to the undercut structure and is electrically connected to the connection portion 154, thereby realizing the electrical connection between the cathode layer 180 and the auxiliary electrode 128.

When the display panel 100 is manufactured, in order to ensure the display panel 100 has a sufficient light transmittance rate, a thickness of the cathode layer 180 needs to be reduced. Therefore, an internal resistance of the surface of the cathode layer 180 is relatively large, resulting in voltage drop due to the internal resistance being serious, thereby leading to the display panel 100 having an uneven display problem, which seriously affects the display effect of the display panel 100. By disposing the auxiliary electrode 128, the cathode layer 180 can be electrically connected to the auxiliary electrode 128, which can reduce the internal resistance of the corresponding area of the display panel 100, thereby reducing effect from the voltage drop of the internal resistance, improving the display uniformity of the display panel 100, and improving display effect of the display panel 100.

It should be noted that, before the cathode layer 180 is formed, the manufacturing method of the display panel 100 further includes manufacturing a pixel definition layer 160 and a light-emitting layer 170, which specifically includes the following contents.

First, forming the pixel definition layer 160 on the planarization layer 140 and the anode layer 150, defining a pixel opening in the pixel definition layer 160, and making the pixel opening expose a part of the anode 155 for connection of a subsequent film layer and the anode 155. Additionally, a second opening is further defined in the pixel definition layer 160. The second opening exposes the undercut structure, so that when the cathode layer 180 is manufactured in subsequent, the cathode layer 180 can be cut off at the edge of the first protruding portion 1541 while is linked to the connection portion 154 simultaneously, thereby realizing the electrical connection between the cathode layer 180 and the auxiliary electrode 128.

Next, evaporating and depositing a layer of light-emitting layer 170 on the pixel definition layer 160 and the anode layer 150. The first protruding portion 1541 can interrupt the light-emitting layer 170, so that the light-emitting layer 170 is cut off at an edge of the first protruding portion 1541. By adjusting an evaporation deposition angle of the light-emitting layer 170 to match an evaporation deposition angle of the cathode layer 180, the cathode layer 180 can be made to fully cover the light-emitting layer 170 and to extend toward the bottom of the first protruding portion 1541. Therefore, effective link between the cathode layer 180 and the connection portion 154 is ensured, thereby realizing the electrical connection between the cathode layer 180 and the auxiliary electrode 128.

Figure 7:
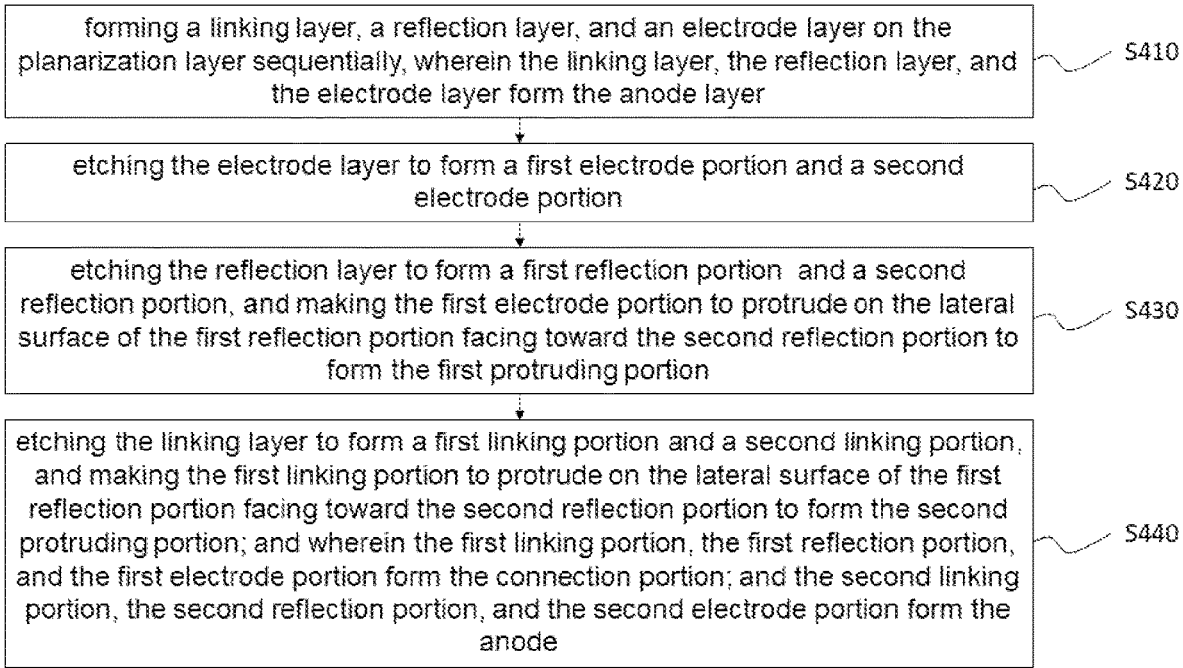
FIG. 7 is a structural schematic diagram of step S400 in FIG. 3 provided by one embodiment of the present application.

Optionally, as illustrated in FIG. 7, in the step S400, forming the anode layer 150 on the planarization layer 140 and processing the anode layer 150 to form the anode 155 and the connection portion 154 spaced apart mainly include following step.

S410: forming a linking layer 151, a reflection layer 152, and an electrode layer 153 on the planarization layer 140 sequentially, wherein the linking layer 151, the reflection layer 152, and the electrode layer 153 form the anode layer 150.

As illustrated in FIG. 8, when the anode layer 150 is manufactured, the linking layer 151 and the reflection layer 152 are sequentially deposited on the planarization layer 140 and are placed in an independent chamber for vacuum oxidation. Then, the electrode layer 153 is deposited on the reflection layer 152. The linking layer 151, the reflection layer 152, and the electrode layer 153 together form the anode layer 150.

Wherein, the linking layer 151 is configured to be electrically connect to an internal structure of the thin film transistor layer 120, to insulate moisture in the planarization layer 140, and to prevent the moisture from entering into the reflection layer 152 and affecting the structural stability of the reflection layer 152. The reflection layer 152 is configured to reflect an external ambient light, so as to prevent the external ambient light from directly irradiating to inside of the display panel 100 and affecting the display effect of the display panel 100. The electrode layer 153 is configured to be electrically connected to the light-emitting pixels, so as to realize control of the light-emitting manner of the light-emitting pixels, thereby realizing control of the display manner of the display panel 100.

S420: etching the electrode layer 153 to form a first electrode portion 1531 and a second electrode portion 1532.

When a patterning process is performed on the anode layer 150, the electrode layer 153 is etched at first. A material of the electrode layer 153 includes indium tin oxide or indium zinc oxide, which can be etched by oxalic acid. Therefore, the oxalic acid can be adopted to act as an etching solution to etch the electrode layer 153 to form the first electrode portion 1531 and the second electrode portion 1532.

It should be noted that the electrode layer 153 is not limited to the aforesaid materials. When the material of the electrode layer 153 is changed, the corresponding used etching solution is also changed, which is not limited specially herein.

S430: etching the reflection layer 152 to form a first reflection portion 1521 and a second reflection portion 1522, and making the first electrode portion 1531 to protrude on the lateral surface of the first reflection portion 1521 facing toward the second reflection portion 1522 to form the first protruding portion 1541.

In one embodiment of the present application, the reflection layer 152 includes an alloy of aluminum, nickel, copper, and lanthanum, which can be etched by aluminum hydroxide. Therefore, when the patterning process is performed on the reflection layer 152, the oxalic acid can be adopted to act as an etching solution to etch the reflection layer 152 to form the first reflection portion 1521 and the second reflection portion 1522.

By adjusting the etching process on the aluminum hydroxide, the reflection layer 152 is etched laterally. Therefore, the first electrode portion 1531 is made to protrude on the lateral surface of the first reflection portion 1521 facing toward the second reflection portion 1522 to form the first protruding portion 1541, while the second electrode portion 1532 can also protrude on the lateral surface of the second reflection portion 1522 facing toward the first reflection portion 1521 to form a third protruding portion.

It should be noted that the reflection layer 152 is not limited to the aforesaid materials. When the material of the reflection layer 152 is changed, the corresponding used etching solution is also changed, which is not limited specially herein.

S440: etching the linking layer 151 to form a first linking portion 1511 and a second linking portion 1512, and making the first linking portion 1511 to protrude on the lateral surface of the first reflection portion 1521 facing toward the second reflection portion 1522 to form the second protruding portion 1542; and wherein the first linking portion 1511, the first reflection portion 1521, and the first electrode portion 1531 form the connection portion 154, and the second linking portion 1512, the second reflection portion 1522, and the second electrode portion 1532 form the anode 155.

In one embodiment of the present application, the linking layer 151 includes molybdenum or an alloy of molybdenum, titanium, and nickel, which can be etched by aluminum hydroxide. Therefore, when the patterning process is performed on the linking layer 151, the aluminum hydroxide can be adopted to act as an etching solution to etch the linking layer 151 to form the first linking portion 1511 and the second linking portion 1512, i.e., the etching of the reflection layer 152 and the linking layer 151 in the embodiment of the present application can be performed at the same time.

As the etching rates of the linking layer 151 and the reflection layer 152 in the aluminum hydroxide are different. Compared to the reflection layer 152, the etching rate of the linking layer 151 in the aluminum hydroxide is slower.

Therefore, the first linking portion 1511 can be made to protrude on the lateral surface of the first reflection portion 1521 facing toward the second reflection portion 1522 to form the second protruding portion 1542. Meanwhile, the second linking portion 1512 can also protrude on the lateral surface of the second reflection portion 1522 facing toward the first reflection portion 1521 to form a fourth protruding portion.

Wherein, the first linking portion 1511, the first reflection portion 1521, and the first electrode portion 1531 form the connection portion 154, and the second linking portion 1512, the second reflection portion 1522, and the second electrode portion 1532 form the anode 155. That is, the undercut structure can be formed on the connection portion 154 while the patterning process is performed on the anode layer 150 by using an etching solution, thereby reducing the number of the photomasks and production costs.

It should be noted that the linking layer 151 is not limited to the aforesaid materials. When the material of the linking layer 151 is changed, the corresponding used etching solution is also changed, which is not limited specially herein. It only needs to ensure that during the patterning process being performed on the anode layer 150 by using the etching solution, the first electrode portion 1531 protrudes on the lateral surface of the first reflection portion 1521 facing toward the anode 155 to form the first protruding portion 1541, and the first linking portion 1511 protrudes on the lateral surface of the first reflection portion 1521 facing toward the anode 155 to form the second protruding portion 1542, i.e., it only needs to form the undercut structure on the connection portion 154 while the patterning process is performed on the anode layer 150 by using the etching solution, which are not specially limited herein.

Wherein, after the patterning process of the anode layer 150 is completed, heat treatment can be performed on the first electrode portion 1531 and the second electrode portion 1532 to densify crystals of the first electrode portion 1531 and the second electrode portion 1532. Therefore, structural strength the first electrode portion 1531 and the second electrode portion 1532 is improved, which can prevent the first electrode portion 1531 and the second electrode portion 1532 from collapsing during manufacturing or usage.

The display panel, the display device, and the manufacturing method of the display panel provided by the embodiments of the present application are described in detail. This article uses specific cases for describing the principles and the embodiments of the present application, and the description of the embodiments mentioned above is only for helping to understand the method and the core idea of the present application. Meanwhile, for those skilled in the art, will have various changes in specific embodiments and application scopes according to the idea of the present application. In summary, the content of the specification should not be understood as limit to the present application.

What is claimed is:

1. A display panel, comprising:
a base substrate;
a thin film transistor layer disposed on the base substrate, wherein the thin film transistor layer comprises an auxiliary electrode;
a planarization layer disposed on the thin film transistor layer, wherein a first opening is defined in the planarization layer, and the first opening exposes the auxiliary electrode;
an anode layer disposed on a side of the planarization layer facing away the base substrate, wherein the anode layer comprises an anode and a connection portion spaced apart, the connection portion comprises a first linking portion, a first reflection portion, and a first electrode portion disposed in a stack along a direction away from the base substrate; the first linking portion is electrically connected to the auxiliary electrode; the first electrode portion protrudes on a lateral surface of the first reflection portion facing toward the anode to form a first protruding portion; the first linking portion protrudes on the lateral surface of the first reflection portion facing toward the anode to form a second protruding portion; the second protruding portion and the first protruding portion form an undercut structure;

a pixel definition layer disposed on the planarization layer and the anode layer, wherein a pixel opening is defined in the pixel definition layer, the pixel opening exposes a part of the anode, a second opening is defined in the pixel definition layer, and the second opening exposes the first protruding portion, the second protruding portion, and a part of the planarization layer;

a light-emitting layer disposed on the pixel definition layer and the anode layer, wherein the light-emitting layer extends into the second opening to be disposed directly on the part of the planarization layer exposed by the second opening and to abut a lateral surface of the first linking portion facing toward the anode, and the light-emitting layer further extends onto a top surface of the first linking portion to partially cover the second protruding portion; and a cathode layer disposed on a side of the light-emitting layer facing away the base substrate, wherein the cathode layer extends into the undercut structure and is electrically connected to the second protruding portion.

2. The display panel as claimed in claim 1, wherein an orthogonal projection of the first protruding portion on the base substrate at least partially overlaps with an orthogonal projection of the second protruding portion on the base substrate.

3. The display panel as claimed in claim 1, wherein the first electrode portion comprises indium tin oxide or indium zinc oxide, the first reflection portion comprises an alloy of aluminum, nickel, copper, and lanthanum; and the first linking portion comprises molybdenum or an alloy of molybdenum, titanium, and nickel.

4. The display panel as claimed in claim 1, wherein the thin film transistor layer comprises a light-shielding layer, a gate electrode layer, and a source-drain layer, and the auxiliary electrode is disposed in a same layer with one of the light-shielding layer, the gate electrode layer, or the source-drain layer.

5. A display device, comprising the display panel as claimed in claim 1.

6. The display panel as claimed in claim 1, wherein the anode comprises a second linking portion, a second reflection portion, and a second electrode portion disposed in a stack along the direction away from the base substrate, the thin film transistor layer comprises a source-drain layer, and the second linking portion is electrically connected to the source-drain layer.

7. The display panel as claimed in claim 6, wherein the second electrode portion protrudes on a lateral surface of the second reflection portion facing toward the connection portion to form a third protruding portion, and the second linking portion protrudes on a lateral surface of the second reflection portion facing toward the connection portion to form a fourth protruding portion.

8. The display panel as claimed in claim 6, wherein the second electrode portion comprises indium tin oxide or indium zinc oxide, the second reflection portion comprises an alloy of aluminum, nickel, copper, and lanthanum; and the second linking portion comprises molybdenum or an alloy of molybdenum, titanium, and nickel.

9. A manufacturing method of a display panel, comprising:

providing a base substrate;

forming a thin film transistor layer on the base substrate, wherein the thin film transistor layer comprises an auxiliary electrode;

forming a planarization layer on the thin film transistor layer, forming a first opening in the planarization layer, and making the first opening to expose the auxiliary electrode;

forming a linking layer, a reflection layer, and an electrode layer on the planarization layer sequentially, wherein the linking layer, the reflection layer, and the electrode layer form the anode layer;

etching the electrode layer to form a first electrode portion and a second electrode portion;

etching the reflection layer to form a first reflection portion and a second reflection portion, making the first electrode portion to protrude from a lateral surface of the first reflection portion facing toward the second reflection portion to form a first protruding portion, etching the linking layer to form a first linking portion and a second linking portion, making the first linking portion to protrude from a lateral surface of the first reflection portion facing toward the second reflection portion to form a second protruding portion, wherein the first linking portion, the first reflection portion, and the first electrode portion form the connection portion; and the second linking portion, the second reflection portion, and the second electrode portion form the anode; wherein the connection portion is electrically connected to the auxiliary electrode, and the first protruding portion and the second protruding portion form an undercut structure;

forming a pixel definition layer on the planarization layer and the anode layer, defining a pixel opening in the pixel definition layer to expose a part of the anode and a second opening to expose the first protruding portion, the second protruding portion, and a part of the planarization layer;

evaporating and depositing a light-emitting layer on the pixel definition layer and the anode layer; wherein the light-emitting layer extends into the second opening to be disposed directly on the part of the planarization layer exposed by the second opening and to abut a lateral surface of the first linking portion facing toward the anode, and the light-emitting layer further extends onto a top surface of the first linking portion to partially cover the second protruding portion; and forming a cathode layer on a side of the anode layer facing away the base substrate, and making the cathode layer extend into the undercut structure and be electrically connected to the second protruding portion.

10. The manufacturing method of the display panel as claimed in claim 9, wherein forming the linking layer, the reflection layer, and the electrode layer on the planarization layer sequentially comprises:

depositing to form the linking layer and the reflection layer on the planarization layer sequentially;

performing a vacuum oxidation process on the linking layer and the reflection layer; and depositing to form the electrode layer on the reflection layer.

11. The manufacturing method of the display panel as claimed in claim 9, wherein a material of the electrode layer comprises indium tin oxide or indium zinc oxide, and etching the electrode layer comprises:
   adopting oxalic acid to etch the electrode layer.

12. The manufacturing method of the display panel as claimed in claim 9, wherein the manufacturing method comprises:
   performing a heat treatment on the first electrode portion and the second electrode portion.

13. The manufacturing method of the display panel as claimed in claim 9, wherein a material of the reflection layer comprises an alloy of aluminum, nickel, copper, and lanthanum, and etching the reflection layer comprises:
   adopting aluminum hydroxide to etch the reflection layer.

14. The manufacturing method of the display panel as claimed in claim 13, wherein a material of the linking layer comprises molybdenum or an alloy of molybdenum, titanium, and nickel, and etching the linking layer comprises:
   adopting aluminum hydroxide to etch the linking layer.

15. The manufacturing method of the display panel as claimed in claim 14, wherein the reflection layer and the linking layer are etched simultaneously.

16. The manufacturing method of the display panel as claimed in claim 15, wherein an etching rate of the linking layer is less than an etching rate of the reflection layer.

* * * * *